United States Patent
Lee et al.

(10) Patent No.: US 10,395,842 B2
(45) Date of Patent: Aug. 27, 2019

(54) THIN FILM CAPACITOR AND MANUFACTURING METHOD THEREOF

(71) Applicant: SAMSUNG ELECTRO-MECHANICS CO., LTD., Suwon-si, Gyeonggi-do (KR)

(72) Inventors: Kyo Yeol Lee, Suwon-si (KR); Seung Mo Lim, Suwon-si (KR); Dong Joon Oh, Suwon-si (KR); Yun Sung Kang, Suwon-si (KR); Hai Joon Lee, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/485,682

(22) Filed: Apr. 12, 2017

(65) Prior Publication Data

US 2018/0061581 A1   Mar. 1, 2018

(30) Foreign Application Priority Data

Aug. 26, 2016 (KR) .................. 10-2016-0109357

(51) Int. Cl.
| | |
|---|---|
| *H01G 4/33* | (2006.01) |
| *H01G 4/012* | (2006.01) |
| *H01G 4/30* | (2006.01) |
| *H01G 4/008* | (2006.01) |
| *H01L 49/02* | (2006.01) |
| *H01G 4/10* | (2006.01) |
| *H01G 4/12* | (2006.01) |

(52) U.S. Cl.
CPC .............. *H01G 4/33* (2013.01); *H01G 4/008* (2013.01); *H01G 4/012* (2013.01); *H01G 4/306* (2013.01); *H01L 28/75* (2013.01); *H01G 4/10* (2013.01); *H01G 4/12* (2013.01)

(58) Field of Classification Search
CPC  H01G 4/33; H01G 4/012; H01G 4/10; H01G 4/306; H01G 4/12
USPC ..................................... 361/301.4
See application file for complete search history.

(56) References Cited

U.S. PATENT DOCUMENTS

| | | | |
|---|---|---|---|
| 2008/0258191 A1 | 10/2008 | Baniecki et al. | |
| 2012/0168207 A1* | 7/2012 | Oh ......................... | H01G 4/005 174/254 |
| 2015/0103465 A1* | 4/2015 | Kang ................... | H01G 4/1227 361/301.4 |

FOREIGN PATENT DOCUMENTS

| | | |
|---|---|---|
| JP | 2007-123683 A | 5/2007 |
| JP | 4382103 B2 | 12/2009 |
| KR | 10-2005-0105556 A | 11/2005 |

OTHER PUBLICATIONS

Lee, Jae-Wung et al., "Effects of Residual Stress on the Electrical Properties of PZT Films", Journal of the American Ceramic Society, vol. 90, No. 4, (2007), pp. 1077-1080.

(Continued)

*Primary Examiner* — Michael P McFadden
(74) *Attorney, Agent, or Firm* — Morgan, Lewis & Bockius LLP (57) ABSTRACT

A thin film capacitor includes a capacitor body formed by alternately stacking first and second electrode layers and a dielectric layer on a substrate, and having the second electrode layer disposed in an uppermost portion thereof, and a stress alleviation layer formed on the uppermost second electrode layer. The stress alleviation layer is formed of a material having a coefficient of thermal expansion higher than those of the substrate and the dielectric layer.

16 Claims, 4 Drawing Sheets

(56) References Cited

OTHER PUBLICATIONS

Shaw, T. M. "The effect of stress on the dielectric properties of barium strontium titanate thin films," Applied Physics Letters, vol. 75, No. 14, Oct. 4, 1999, pp. 2129-2131.

* cited by examiner

ALTERNATELY STACK FIRST AND SECOND ELECTRODE LAYERS AND DIELECTRIC LAYER TO FORM CAPACITOR BODY SUCH THAT SECOND ELECTRODE LAYER IS DISPOSED IN UPPERMOST PORTION

FORM STRESS ALLEVIATION LAYER ON CAPACITOR BODY

COOL CAPACITOR BODY WITH STRESS ALLEVIATION LAYER TO ROOM TEMPERATURE

FIG. 5

COMPARATIVE EXAMPLE
FIG. 6A

COMPARATIVE EXAMPLE
FIG. 6B

THIN FILM CAPACITOR AND MANUFACTURING METHOD THEREOF

CROSS-REFERENCE TO RELATED APPLICATION(S)

This application claims the benefit of priority to Korean Patent Application No. 10-2016-0109357, filed on Aug. 26, 2016 in the Korean Intellectual Property Office, the entire disclosure of which is incorporated herein by reference.

BACKGROUND

1. Technical Field

The present disclosure relates to a thin film capacitor and a manufacturing method thereof.

2. Description of Related Art

As application processors of smartphones have recently been reduced in thickness, there is an increased demand for thin film capacitors, which may have a thickness smaller than that of multilayer ceramic capacitors (MLCCs).

A thin film capacitor is manufactured by depositing a first internal electrode, a dielectric layer, and a second electrode layer on a substrate, using a thin film technology. A thin film capacitor manufactured through a thin film method is thinner than one manufactured using an existing stacking ceramic method, while including a smaller number of dielectric layers to be stacked. Thus, the thin film capacitor may be applied advantageously to a compact product such as a cellular phone.

When heterogeneous materials are used during a thin film process, stress may be applied to a dielectric layer, in which case the degree of stress may be varied, depending on lattice constants, coefficients of thermal expansion, thicknesses, and the like, between different materials comprising the substrate and the dielectric layer. Specifically, in a case in which the substrate is a silicon substrate, when the resultant structure is cooled to room temperature after the dielectric layer is formed, stress is generated in the dielectric layer due to a difference in the coefficients of thermal expansion between the silicon substrate and a material of the dielectric layer, causing shapes thereof to be changed, thus degrading the dielectric characteristics of the dielectric layer and reducing the capacitance.

When a thickness of the substrate of the manufactured capacitor is reduced through a grinding method, stress applied to the dielectric layer may be reduced, due to the thickness of the substrate being reduced, while characteristics of the dielectric material, i.e., capacitance characteristics, may be increased.

In order to reduce tensile stress generated during a thin film capacitor manufacturing process of forming the dielectric layer on the substrate, a thickness of the dielectric layer may be increased or a thickness of the substrate may be decreased. However, when the thickness of the dielectric layer is increased, capacitance is reduced, and when the thickness of the substrate is excessively reduced, breaking strength of the substrate is lowered, failing to secure reliability of the product.

Thus, a method for reducing stress generated in the dielectric layer is required.

SUMMARY

An aspect of the present disclosure may provide a thin film capacitor having capacitance enhanced by reducing stress generated in a dielectric layer.

According to an aspect of the present disclosure, a thin film capacitor may include: a capacitor body formed by alternately stacking first and second electrode layers and a dielectric layer on a substrate, and having the second electrode layer disposed in an uppermost portion thereof; and a stress alleviation layer formed on the second electrode layer of the uppermost portion. The stress alleviation layer is formed of a material having a coefficient of thermal expansion higher than those of the substrate and the dielectric layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Exemplary embodiments in the present disclosure will now be described in detail, with reference to the accompanying drawings.

Hereinafter, a thin film capacitor according to an exemplary embodiment in the present disclosure will be described.

Figure 1:
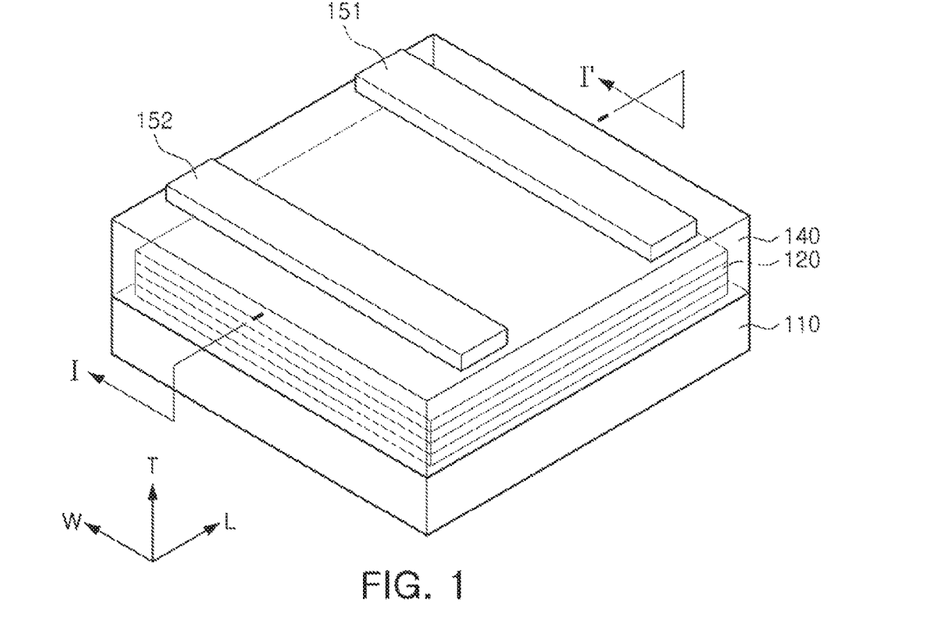
FIG. 1 is a perspective view schematically illustrating a thin film capacitor according to an exemplary embodiment in the present disclosure.
Figure 2:
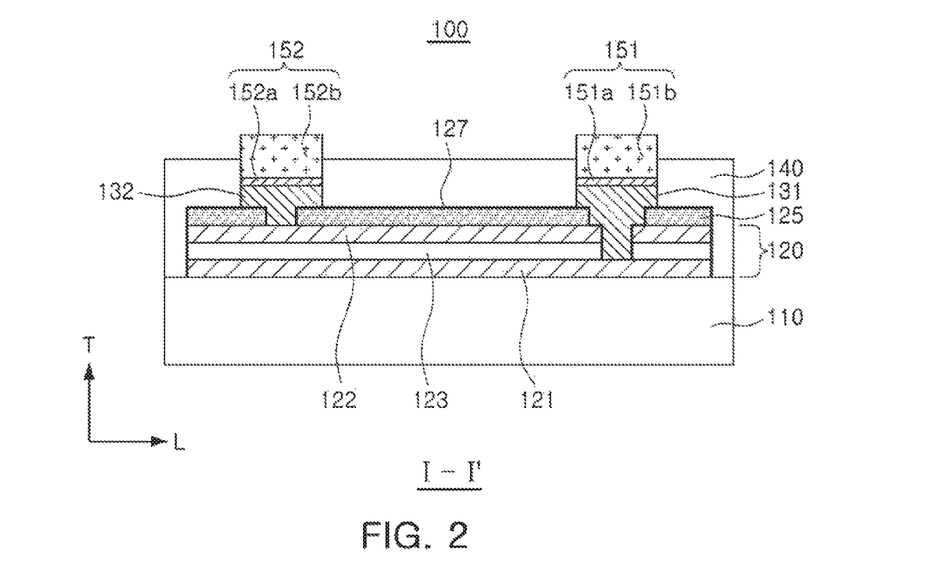
FIG. 2 is a cross-sectional view of a thin film capacitor according to an exemplary embodiment in the present disclosure, taken along line I-I' of FIG. 1.

FIG. 1 is a perspective view schematically illustrating a thin film capacitor according to an exemplary embodiment in the present disclosure, and FIG. 2 is a cross-sectional view of a thin film capacitor according to an exemplary embodiment in the present disclosure, taken along line I-I' of FIG. 1.

Referring to FIGS. 1 and 2, a thin film capacitor 100 according to an exemplary embodiment in the present disclosure includes a capacitor body 120, formed by alternately stacking first and second electrode layers 121 and 122 and a dielectric layer 123 on a substrate 110, and having the second electrode layer 122 disposed at an uppermost portion thereof and a stress alleviation layer 125 formed on the second electrode layer 122 of the uppermost portion. The stress alleviation layer 125 is formed of a material having a coefficient of thermal expansion higher than those of the substrate 110 and the dielectric layer 123.

The substrate 110 has insulating properties in a layer (substrate) in contact with the first electrode layer 121, and may be $SiO_2/Si$. The substrate 110 preferably has sufficient flatness and surface roughness.

Figure 3:
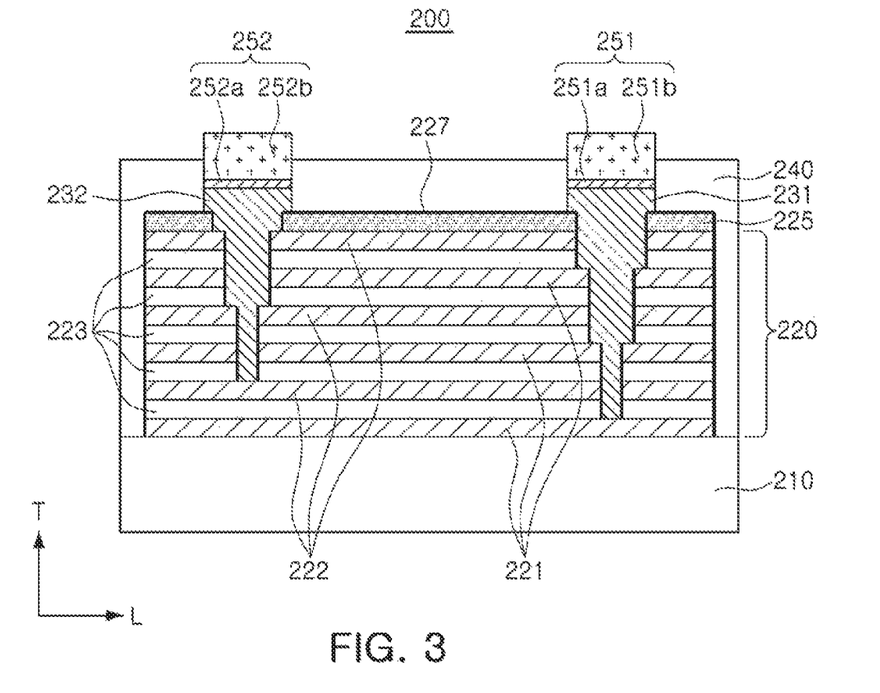
FIG. 3 is a cross-sectional view schematically illustrating a thin film capacitor according to another exemplary embodiment in the present disclosure.

FIG. 3 is a cross-sectional view schematically illustrating a thin film capacitor according to another exemplary embodiment in the present disclosure, illustrating a structure in which a plurality of dielectric layers 223 and a plurality of first and second electrode layers 221 and 222 are stacked.

Referring to FIGS. 2 and 3, the capacitor bodies 120 and 220, having a stacked structure in which first electrode layers 121 and 221 are formed on the substrates 110 and 210, respectively, dielectric layers 123 and 223 are formed on the first electrode layers 121 and 221, respectively, and second electrode layers 122 and 222 are formed on the dielectric layers 123 and 223, respectively, may have a form in which a plurality of first electrode layers 121 and 221 and a plurality of second electrode layers 122 and 222 are alternately stacked, with the dielectric layers 123 and 223 therebetween, respectively, and is not limited to the stacking number illustrated in the drawing. Here, the second electrode layers 122 and 222 may be disposed in uppermost portions of the capacitor bodies 120 and 220, respectively.

A thickness of the dielectric layer may be 1 μm or less, and thicknesses of the first and second electrode layers may be 500 nm or less. Here, since the thickness of the dielectric layer is in inverse proportion to capacitance, the dielectric layer is formed to be as thin as possible and may have a thickness ranging from 100 to 300 nm, in consideration of a problem that leakage current characteristics are degraded if the dielectric layer is too thin.

The first and second electrode layers may have a thickness generally ranging from 100 to 200 nm, in consideration of cost and electric resistance of high-priced metals, such as platinum (Pt), ruthenium (Ru), or iridium (Ir). Further, the first and second electrode layers may be formed of a material having a coefficient of thermal expansion similar to that of the dielectric layer and good suitability with the dielectric layer, i.e., a material that easily forms a film.

As the first and second electrode layers and the dielectric layer are increasingly stacked as multiple layers, equivalent series resistance (ESR) of the capacitor may be reduced.

The first and second electrode layers may be formed as a single layer without a predetermined pattern.

The first and second electrode layers may be formed of a conductive material.

The conductive material may be one selected from among platinum (Pt), iridium (Ir), ruthenium (Ru), $IrO_2$, and $RuO_2$, but is not limited thereto.

A high temperature heat history may be entailed during a process of forming the dielectric layer, a high-k thin film, which may cause the electrode layer to be spread to the dielectric layer or to react to the dielectric layer, to increase a leakage current in the capacitor.

Here, the first and second electrode layers 121 and 122 may be formed of platinum (Pt), a high melting point material, whereby spreading or reaction thereof to the dielectric layer may be reduced.

The dielectric layer may include a perovskite material having high permittivity.

The perovskite material may be one selected from dielectric materials whose permittivity may be significantly changed, for example, barium titanate ($BaTiO_3$)-based material, a strontium titanate ($SrTiO_3$)-based material, a (Ba, Sr)$TiO_3$-based material, and (Pb, Zr) $TiO_3$-based material, but is not limited thereto.

In the present disclosure, first and second vias may have different polarities.

Referring to FIGS. 2 and 3, first vias 131 and 231 may be electrically connected to the first electrode layers 121 and 221, respectively, and penetrate through from one surface of the body to the first electrode layers 121 and 221, the lowermost layers adjacent to the substrates 110 and 210, respectively, and second vias 132 and 232 may be electrically connected to the second electrode layers 122 and 222, respectively, and penetrate through from one surface of the body to the second electrode layers 122 and 222, the lowermost layers adjacent to the substrates 110 and 210, respectively. The first vias 131 and 231 and the second vias 132 and 232 may be electrically insulated from each other.

The first and second vias 131, 132, 231, and 232 may be alternately disposed in one direction and may be alternately disposed in a zigzag manner on the same line or in one direction.

When the first vias and the second vias are close to each other, a current may be generated in a direction in which magnetic induction is canceled out, to suppress magnetic inductions, and since a current path is shortened to reduce resistance, ESR and equivalent series inductance (ESL) may be effectively reduced.

The first and second vias may be formed by forming a plurality of first and second via holes alternately within the body in a stacking direction of the body, and filling the first and second via holes with a conductive material.

The conductive material may be copper (Cu), aluminum (Al), gold (Au), silver (Ag), platinum (Pt), and the like, but is not limited thereto.

When the first and second vias are formed in plurality, a contact surface thereof in contact with each of the first and second electrode layers may be increased, to lower ESR of the capacitor.

Figure 6A:
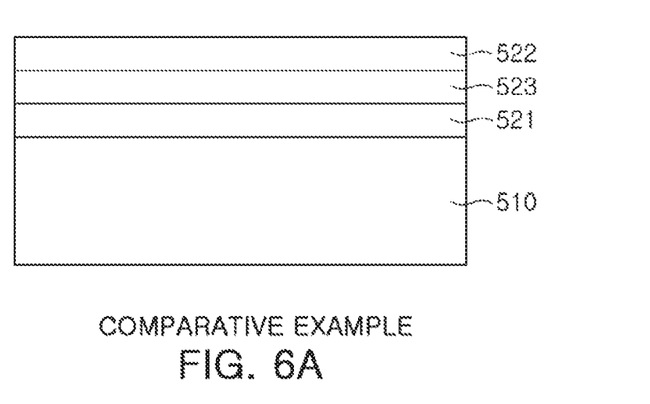
FIGS. 6A and 6B are cross-sectional views schematically illustrating a stress distribution of a thin film capacitor of a comparative example.
Figure 6B:
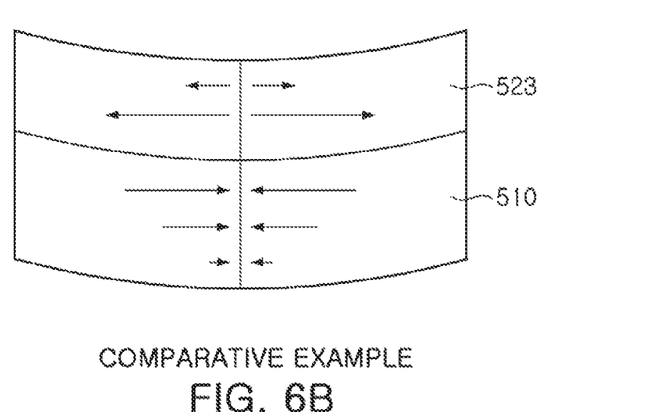

FIGS. 6A and 6B are cross-sectional views schematically illustrating a stress distribution of a thin film capacitor according to a comparative example.

In general, a thin film capacitor may be formed by depositing electrode layers 521 and 522 and a dielectric layer 523 on a substrate 510 through a thin film deposition method, and, in order to form the dielectric layer, a deposition or heat treatment process should be performed at high temperatures. A temperature for manufacturing a dielectric layer generally ranges from 400° C. to 700° C., although the temperature may be different, depending on the materials used for manufacturing the dielectric layers and the manufacturing method.

Due to a difference in the coefficient of thermal expansion between silicon (Si), used as a material of the substrate 510 and of the dielectric layer 523 (Si: $2.55*10^{-6}$/K and dielectric material: $6*10^{-6}$/K), stress is generated during a process of cooling to room temperature after high temperature deposition, which causes the dielectric layer 523 to be deformed and have a concave shape, as illustrated in FIG. 6B. Such stress reduces the dielectric properties of the dielectric material and reduces capacitance.

In order to secure dielectric properties by reducing stress applied to the dielectric layer by the substrate, a thickness of the substrate may be reduced through a grinding method. Here, however, if the substrate becomes too thin, breaking strength of the substrate may be lowered too much to secure reliability of a product.

In contrast, in an exemplary embodiment in the present disclosure, the stress alleviation layer 125 is provided on the second electrode layer of the uppermost portion of the capacitor body, and, in this case, the stress alleviation layer 125 is formed of a material having a coefficient of thermal expansion higher than those of the substrate and the dielectric layer. Due to the stress alleviation layer, tensile stress remaining in the dielectric layer during a process of cooling from a high temperature deposition temperature to room temperature after manufacturing the capacitor body may be reduced, and thus capacitance of the dielectric layer may be secured.

The stress alleviation layer 125 may be formed of a material different from those of the substrate and the dielectric layer, and may be formed of a material having a coefficient of thermal expansion 1.5 to 10 times higher than those of the substrate and dielectric layer.

The stress alleviation layer 125 may be formed of a metal including aluminum (Al), copper (Cu), magnesium (Mg) or nickel (Ni), or a ceramic including $Al_2O_3$, MgO, and the like.

A thickness of the stress alleviation layer 125 may range from 50 nm to 500 nm, and preferably is a thickness sufficient for securing dielectric properties of the dielectric layer.

If the stress alleviation layer is too thin, less than 50 nm, the stress alleviation layer may not properly serve as an alleviation layer, and if the stress alleviation layer is too thick, in excess of 500 nm, the balance of stress distribution among the stress alleviation layer, the substrate, and the dielectric layer may be lost, to lead to delamination or severe bending, which causes difficulty in a follow-up process. Thus, the thickness of the stress alleviation layer is preferably a thickness appropriate for the dielectric properties of the dielectric layer and a follow-up process.

Figure 4A:
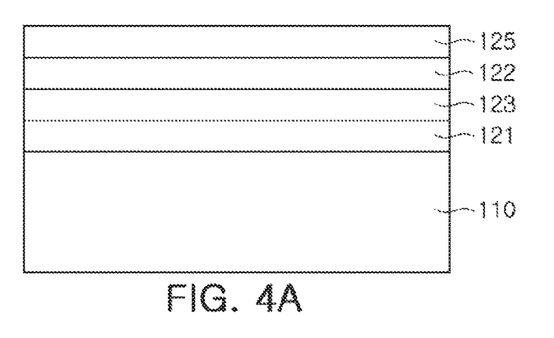
FIGS. 4A and 4B are cross-sectional views schematically illustrating a stress distribution of the thin film capacitor of FIG. 1.
Figure 4B:
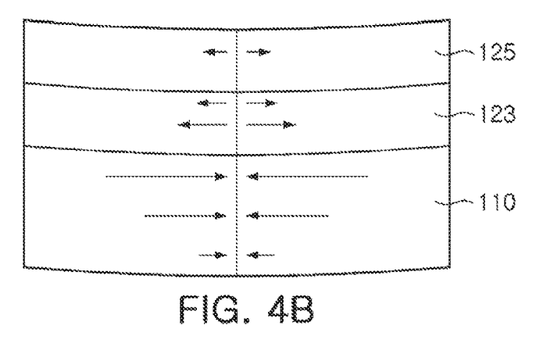

FIGS. 4A and 4B are cross-sectional views schematically illustrating stress distribution of the thin film capacitor of FIG. 1.

Referring to FIGS. 4A and 4B, compressive stress is applied to the substrate 110, and, in this case, the stress may be stronger than that found in the related art. Conversely, as for stress applied to the dielectric layer 123, a radius curvature and tensile stress are reduced due to the stress alleviation layer 125, compared with the related art, thus dielectric properties may be higher.

The same electrode material used as a material of the second electrode layer positioned on the uppermost layer of the capacitor body, such as Pt, Ir, Ru, and the like, may be deposited to be as thick as the stress alleviation layer, to reduce stress on the dielectric layer, but this is not effective in terms of manufacturing cost. Thus, a stress alleviation layer formed of a low-priced material is preferably disposed on the second electrode layer.

First and second external electrodes (not shown) are formed to connect the first and second vias and first and second electrode pads, respectively.

The first and second external electrodes may be formed of a conductive material, and may be formed through a plating method.

The conductive material may be copper (Cu), aluminum (Al), gold (Au), silver (Ag), platinum (Pt), and the like, but is not limited thereto.

The first and second electrode pads 151 and 152 may be formed on the first and second external electrodes, respectively, and may include a conductive material such as Cu, Al, Au, Ag, Pt, and the like.

The first and second electrode pads 151 and 152 may include a conductive material.

The conductive material may be Cu, Al, Au, Ag, Pt, and the like, but is not limited thereto.

The first and second electrode pads 151 and 152 may include seed layers 151a and 152a and electrode layers 151b and 152b, grown from the seed layers 151a and 152a.

The first and second electrode pads 151 and 152 are disposed in positions where the first and second electrode pads 151 and 152 do not overlap the first and second vias, respectively, with respect to a stacking direction of the dielectric layer and the electrode layers.

The first and second electrode pads 151 and 152 may be integrated with first and second connection electrodes or may be disposed on the first and second connection electrodes.

The first and second electrode pads may be integrated with the first and second external electrodes but are not limited thereto.

In order to electrically connect the first via 131 and the second via 132 to the first electrode 121 and the second electrode 122, respectively, an insulating layer 127 is formed.

The insulating layer 127 may be formed between the first via 131, the dielectric layer 123, and the second electrode layer 122, and between the second via 132, the dielectric layer 123, and the first electrode layer 121.

The insulating layer 127 may secure insulation between the first via and the second electrode layer and insulation between the second via and the first electrode layer, and since the insulating layer 127 is formed on a surface of the dielectric layer, parasitic capacitance generated therein may be reduced.

The insulating layer 127 may be formed of an organic material such as benzocyclobutene (BCB), polyimide, and the like, or an inorganic material such as $SiO_2$, $Si_3N_4$, and the like, and has permittivity lower than that of a material of the dielectric layer, in order to obtain high insulating properties and reduce parasitic capacitance.

The insulating layer 127 may be formed through chemical vapor deposition (CVD), allowing a film to have a uniform thickness in a three-dimensionally complex shape.

A protective layer 140 may be formed to prevent a degradation of a material of the capacitor body and the first and second external electrodes due to a chemical reaction with humidity and oxygen from the outside, contamination, and damage when the capacitor is mounted.

The protective layer 140 may be formed of a material with high heat resistance and may be formed of an organic heat-curing material or a photo-curing material such as polyimide, for example.

The protective layer 140 may be formed through a photoresist exposing and developing method, a spray coating method, or a dipping method, using a polymer coating solution with low viscosity, but is not limited thereto.

Hereinafter, a method for manufacturing a thin film capacitor according to the present disclosure will be described.

Figure 5:
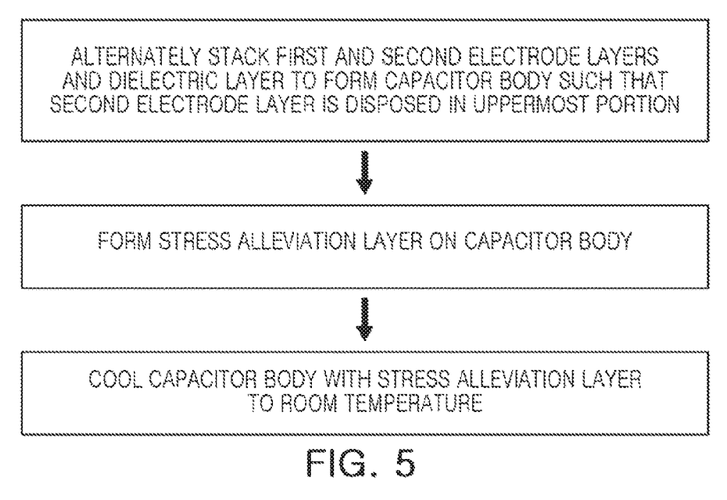
FIG. 5 is a flow chart illustrating a method for manufacturing a thin film capacitor according to an exemplary embodiment in the present disclosure.

FIG. 5 is a flow chart illustrating a method for manufacturing a thin film capacitor according to an exemplary embodiment in the present disclosure.

Referring to FIG. 5, a method for manufacturing a thin film capacitor according to an exemplary embodiment in the present disclosure includes alternately stacking first and second electrode layers and a dielectric layer to form a capacitor body, such that the second electrode layer is disposed in an uppermost portion thereof, forming a stress alleviation layer on the second electrode layer of the uppermost portion of the stacked body (or the laminate), and cooling the capacitor body with the stress alleviation layer to room temperature, wherein the stress alleviation layer is formed of a material having a coefficient of thermal expansion higher than those of the substrate and the dielectric layer.

First, first and second electrode layers and a dielectric layer are alternately stacked on one surface of a substrate to form a capacitor body in which the second electrode is disposed in an uppermost portion thereof.

A layer (substrate) of the substrate directly below the first electrode layer has insulation properties and may be made of SiO$_2$/Si. The substrate preferably has sufficient flatness and surface roughness.

The first and second electrode layers are formed on the substrate and may be formed of a conductive material.

The conductive material may be one selected from among Pt, Ir, Ru, IrO$_2$, RuO$_2$, and the like.

The first and second electrode layers may be formed through a vapor phase synthesis method such as a sputtering method, a vapor deposition method, and the like, and may be processed through photolithography and dry etching.

The first electrode layer may have a flat surface, ensuring high crystallinity of the dielectric layer formed on an upper surface of the first electrode layer.

The dielectric layer may include perovskite as a material having high permittivity.

The perovskite material may be a dielectric material, the permittivity of which may be significantly changed, for example, a barium titanate (BaTiO$_3$)-based material, a strontium titanate (SrTiO$_3$)-based material, a (Ba, Sr) TiO$_3$-based material, and a (Pb, Zr) TiO$_3$-based material, but is not limited thereto.

The dielectric layer may be formed through a sol-gel method, sputter deposition, a metal organic chemical vapor deposition (MOCVD), a plasma enhanced chemical vapor deposition (PECVD), laser ablation, and the like.

The dielectric layer may have high crystallinity, to secure high permittivity.

Crystallinity of the dielectric layer may be adjusted by a temperature, during the formation of the dielectric layer, or by an annealing temperature, after the dielectric layer is formed.

Crystallinity of the dielectric layer may be increased by ensuring a high temperature at the time of formation of the dielectric layer or by ensuring a high annealing temperature after the formation of the dielectric layer.

When the dielectric layer is formed, a grain of the dielectric layer may have at least two or more types of (100) plane, (111) plane, and (110) plane in a crystal growth direction, and the crystal growth direction of the grain may be adjusted by the temperature at the time of formation of the dielectric layer or by the annealing temperature after formation of the dielectric layer.

The first and second electrode layers 121 and 122 or the dielectric layer 223 may be surface-treated.

The surface treatment, a method for planarizing a surface, may be performed through etching and polishing. For example, the surface treatment may be a dry etching method, such as an ion beam etching method, or a method such as chemical mechanical polishing (CMP), but is not limited thereto.

Next, a stress alleviation layer is formed on the second electrode layer of the uppermost portion of the stacked body.

The stress alleviation layer may be formed of a metal such as Al, Cu, Mg, Ni, and the like, or a ceramic such as Al$_2$O$_3$, MgO, and the like.

The stress alleviation layer may be formed through a vapor phase synthesis method such as a sputtering method, a vapor deposition method, and the like, and may be processed by photolithography and dry etching.

The dielectric layer and the stress alleviation layer may be formed at 400° C. to 700° C.

After the manufacturing of the capacitor body and the stress alleviation layer, when the stacked body is cooled to room temperature from a high-temperature deposition temperature, tensile stress may occur in the dielectric layer due to a difference in the coefficient of thermal expansion between the substrate and the dielectric layer.

Since the stress alleviation layer is formed of a material having a coefficient of thermal expansion higher than those of the substrate and the dielectric layer, tensile stress remaining in the dielectric layer during the cooling process may be reduced, securing the capacitance of the thin film capacitor.

Thereafter, a via may be formed in the body to electrically connect the electrode layer to the outside.

The via may be formed by alternately forming a plurality of via holes within the body in the stacking direction of the body and filling the via hole with a conductive material.

The via hole may be filled with a conductive material through a plating method. The first and second via holes may be formed through laser punching or a mechanical punching method but is not limited thereto.

The conductive material may be Cu, Al, Au, Ag, Pt, and the like, but is not limited thereto.

The same descriptions as those of characteristics of a coil electronic component according to an exemplary embodiment in the present disclosure described above, excluding the foregoing descriptions, will be omitted.

As set forth above, according to an exemplary embodiment in the present disclosure, capacitance of the capacitor may be enhanced by reducing stress generated in the dielectric layer.

While exemplary embodiments have been shown and described above, it will be apparent to those skilled in the art that modifications and variations could be made without departing from the scope of the present invention, as defined by the appended claims.

What is claimed is:

1. A thin film capacitor comprising:
a capacitor body formed by alternately stacking first and second electrode layers and a dielectric layer on a substrate, and having the second electrode layer disposed in an uppermost portion thereof; and
a stress alleviation layer formed on the uppermost second electrode layer,
wherein the stress alleviation layer is formed of a material having a coefficient of thermal expansion higher than those of the substrate and the dielectric layer,
wherein the dielectric layer is composed of a material having a coefficient of thermal expansion higher than that of the substrate, and
wherein the substrate includes SiO$_2$/Si.

2. The thin film capacitor of claim 1, wherein the stress alleviation layer is formed of a metal including aluminum (Al), copper (Cu), magnesium (Mg) or nickel (Ni), or a ceramic including one of Al$_2$O$_3$ and MgO.

3. The thin film capacitor of claim 1, wherein a thickness of the stress alleviation layer is within a range of 50 nm to 500 nm.

4. The thin film capacitor of claim 3, wherein the stress alleviation layer is formed of a material different from a material of the dielectric layer.

5. The thin film capacitor of claim 1, wherein the first and second electrode layers are formed of platinum (Pt), iridium (Ir), ruthenium (Ru), IrO$_2$, or RuO$_2$.

6. The thin film capacitor of claim 5, wherein a thickness of each of the first and second electrode layers is 500 nm or less.

7. The thin film capacitor of claim 1, wherein a thickness of the dielectric layer is 1 μm or less.

8. The thin film capacitor of claim 1, wherein the first and second electrode layers and the dielectric layer are each stacked in plurality.

9. The thin film capacitor of claim 3, wherein the stress alleviation layer is formed of a material having a coefficient of thermal expansion 1.5 to 10 times higher than those of the substrate and dielectric layer.

10. The thin film capacitor of claim 1, further comprising first and second vias electrically connected to the first and second electrode layers, respectively, and penetrating through from one surface of the body to the lowermost first and second electrode layers adjacent to the substrate, respectively.

11. The thin film capacitor of claim 10, wherein the first and second vias are alternately disposed in one direction or in a zigzag manner in one direction.

12. A method for manufacturing a thin film capacitor, the method comprising steps of: alternately stacking first and second electrode layers and a dielectric layer on a substrate to form a capacitor body, such that the second electrode layer is disposed in an uppermost portion thereof; forming a stress alleviation layer on the uppermost second electrode layer of the capacitor body; and cooling the capacitor body with the stress alleviation layer to room temperature, wherein the stress alleviation layer is formed of a material having a coefficient of thermal expansion higher than those of the substrate and the dielectric layer, wherein the dielectric layer is composed of a material having a coefficient of thermal expansion higher than that of the substrate, and wherein the substrate includes $SiO_2/Si$.

13. The method of claim 12, wherein the stress alleviation layer is formed of a metal including aluminum (Al), copper (Cu), magnesium (Mg) or nickel (Ni), or a ceramic including Al2O3 or MgO.

14. The method of claim 12, wherein the capacitor body and the stress alleviation layer are formed through a vapor phase synthesis method including a sputtering method or a vapor deposition method.

15. The method of claim 12, wherein the dielectric layer and the stress alleviation layer are formed at 400° C. to 700° C.

16. The method of claim 12, further comprising a step of forming first and second vias in the body to respectively electrically connect the first and second electrode layers to the outside, wherein the first and second vias are formed by alternately forming a plurality of via holes within the body in the stacking direction of the body and filling the via holes with a conductive material.

* * * * *